(12) United States Patent
Saito et al.

(10) Patent No.: US 7,774,667 B2
(45) Date of Patent: Aug. 10, 2010

(54) SEMICONDUCTOR DEVICE AND DATA PROCESSING SYSTEM

(75) Inventors: Tatsuya Saito, Tokyo (JP); Kaname Yamasaki, Tokyo (JP); Iwao Suzuki, Tokyo (JP); Takeshi Bingo, Tokyo (JP); Keiichi Horie, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 313 days.

(21) Appl. No.: 12/054,366

(22) Filed: Mar. 24, 2008

(65) Prior Publication Data

US 2008/0263414 A1    Oct. 23, 2008

(30) Foreign Application Priority Data

Apr. 17, 2007    (JP)    ............................. 2007-107772

(51) Int. Cl.
*G01R 31/28*    (2006.01)

(52) U.S. Cl. ....................................... 714/733; 714/718

(58) Field of Classification Search ................. 711/217; 714/30, 763, 719, 717, 733, 718
See application file for complete search history.

(56) References Cited

U.S. PATENT DOCUMENTS

| | | | |
|---|---|---|---|
| 5,844,914 A | | 12/1998 | Kim et al. |
| 6,321,320 B1 * | | 11/2001 | Fleischman et al. ......... 711/217 |
| 6,550,033 B1 * | | 4/2003 | Dwork ....................... 714/733 |
| 6,760,865 B2 * | | 7/2004 | Ledford et al. ................ 714/30 |
| 7,020,820 B2 * | | 3/2006 | Caty et al. ................... 714/733 |
| 7,096,393 B2 * | | 8/2006 | Caty et al. ................... 714/718 |
| 7,225,379 B2 | | 5/2007 | Yonaga |
| 7,249,295 B2 | | 7/2007 | Fukuyama et al. |
| 7,392,442 B2 * | | 6/2008 | Averbuj et al. .............. 714/718 |
| 2006/0090106 A1 * | | 4/2006 | Evans et al. ................. 714/718 |
| 2007/0136640 A1 * | | 6/2007 | Jarrar ......................... 714/763 |

FOREIGN PATENT DOCUMENTS

| | | |
|---|---|---|
| JP | 10-69800 A | 3/1998 |
| JP | 2004-93433 A | 3/2004 |
| JP | 2005-332555 A | 12/2005 |

* cited by examiner

*Primary Examiner*—David Ton
(74) *Attorney, Agent, or Firm*—Miles & Stockbridge P.C.

(57) ABSTRACT

The test design cost of a circuit capable of accessing an external memory is reduced. There is included a built-in self-test circuit for use in testing an external memory separately from a memory controller for performing memory control in response to an access request to the external memory capable of being coupled to a memory interface, and a TAP controller is used to control the built-in self-test circuit and referring to a test result. There is adopted a multiplexer for switchably selecting the memory controller or the built-in self-test circuit as a circuit for coupling to the memory interface in accordance with control information externally inputted through the TAP controller. The built-in self-test circuit programmably generates and outputs a pattern for a memory test in accordance with an instruction inputted through the TAP controller, and compares data read from the external memory with an expected value.

20 Claims, 17 Drawing Sheets

SEMICONDUCTOR DEVICE AND DATA PROCESSING SYSTEM

CROSS-REFERENCE TO RELATED APPLICATIONS

The disclosure of Japanese Patent Application No. 2007-107772 filed on Apr. 17, 2007 including the specification, drawings and abstract is incorporated herein by reference in its entirety.

BACKGROUND OF THE INVENTION

The present invention relates to a semiconductor device having a built-in self-test (BIST) circuit for testing an external memory, and to a technique effective when applied to a semiconductor device in system-on-chip form and a semiconductor device in system-in-package form having mounted therein a memory chip along with a data processor in system-on-chip form.

In a prior art search conducted after the completion of the present invention, the following known documents are found. Japanese Unexamined Patent Publication No. 2004-093433 describes a technique for directly performing the operation test of a flash memory using a TAP (Test Access Port) controller. Test information such as a command and an address is directly provided to the flash memory through the use of a scan chain in which input/output is controlled by the TAP controller. Japanese Unexamined Patent Publication No. 2005-332555 describes a BIST circuit for carrying out performance comparison of an SDRAM to be tested, in which a test pattern is generated based on control information inputted through the use of a TAP controller and supplied to the SDRAM, and an output from the SDRAM is inputted to the BIST circuit. Japanese Unexamined Patent Publication No. Hei10 (1998)-069800 describes a semiconductor integrated circuit having a test circuit for refreshing a memory circuit during testing.

SUMMARY OF THE INVENTION

The present inventors have investigated the following points on the self-test function of an external memory in a semiconductor integrated circuit such as a data processor capable of accessing the external memory. For example, the inventors have investigated a semiconductor module formed as one SIP (System in Package) by coupling a data processor and an external memory such as a DDR2-SDRAM which are formed in mutually different semiconductor chips. According thereto, the specification of the external memory differs depending on the manufacturer of the semiconductor integrated circuit. Even in the case where the specification of the external memory conforms to the JEDEC standard, it is limited to the external terminal function and terminal arrangement of the package. The internal specification of the chip differs depending on each manufacturer. In the case where a BIST circuit for such an external memory is incorporated in the data processor, it is not efficient to individualize the BIST circuit according to the specification of the external memory. It is possible to allow a CPU to execute a test program for a test by a memory controller without using the BIST circuit; however, in order to perform a variety of memory tests, the specification of the memory controller has to be sufficiently disclosed. In the case where the memory controller is designed based on a customer specification or a design asset such as an IP (intellectual property) module is used as it is, the test function is unavoidably constrained. In consideration of these circumstances, it has been found that the adoption of a BIST circuit broadly adaptable to the difference between specifications of memories to be tested is useful to reduce test design cost. However, there is no description of such a viewpoint in any of the above documents.

It is an object of the present invention to provide a semiconductor device which can reduce the test design cost of a circuit capable of accessing an external memory.

It is another object of the invention to provide a semiconductor device which can easily support a memory test in accordance with the difference of the specification of a memory to be tested.

The above and other objects and novel features of the present invention will be apparent from the description of this specification and the accompanying drawings.

A representative aspect of the invention will be briefly described below.

That is, there is included a built-in self-test circuit for use in testing an external memory separately from a processing unit for performing memory control in response to an access request to the external memory capable of being coupled to a memory interface, and a TAP controller, for example, is used to control the built-in self-test circuit and referring to a test result. There is adopted a multiplexer for switchably selecting the processing unit or the built-in self-test circuit as a circuit for coupling to the memory interface in accordance with control information externally inputted through the TAP controller. The built-in self-test circuit programmably generates and outputs an address, data, and a command for a memory test in accordance with an instruction inputted through the TAP controller, and compares data read from the external memory with expected data.

With this, the content of self-testing is not limited by the function of the processing unit. Since the built-in self-test circuit can generate an address, data, and a command for a memory test, in response to an instruction according to the specification of the memory to be tested, from the TAP controller; the individual design change of the BIST circuit in accordance with the difference of the specification of the memory to be tested can be reduced.

The advantageous effects of the representative aspect of the invention will be briefly described below.

It is possible to reduce the test design cost of a circuit capable of accessing an external memory in a semiconductor integrated circuit.

Further, it is possible to easily support a memory test in accordance with the difference of the specification of a memory to be tested.

DETAILED DESCRIPTION OF THE PREFERRED EMBODIMENTS

1. Outline of Embodiments

Figure 1:
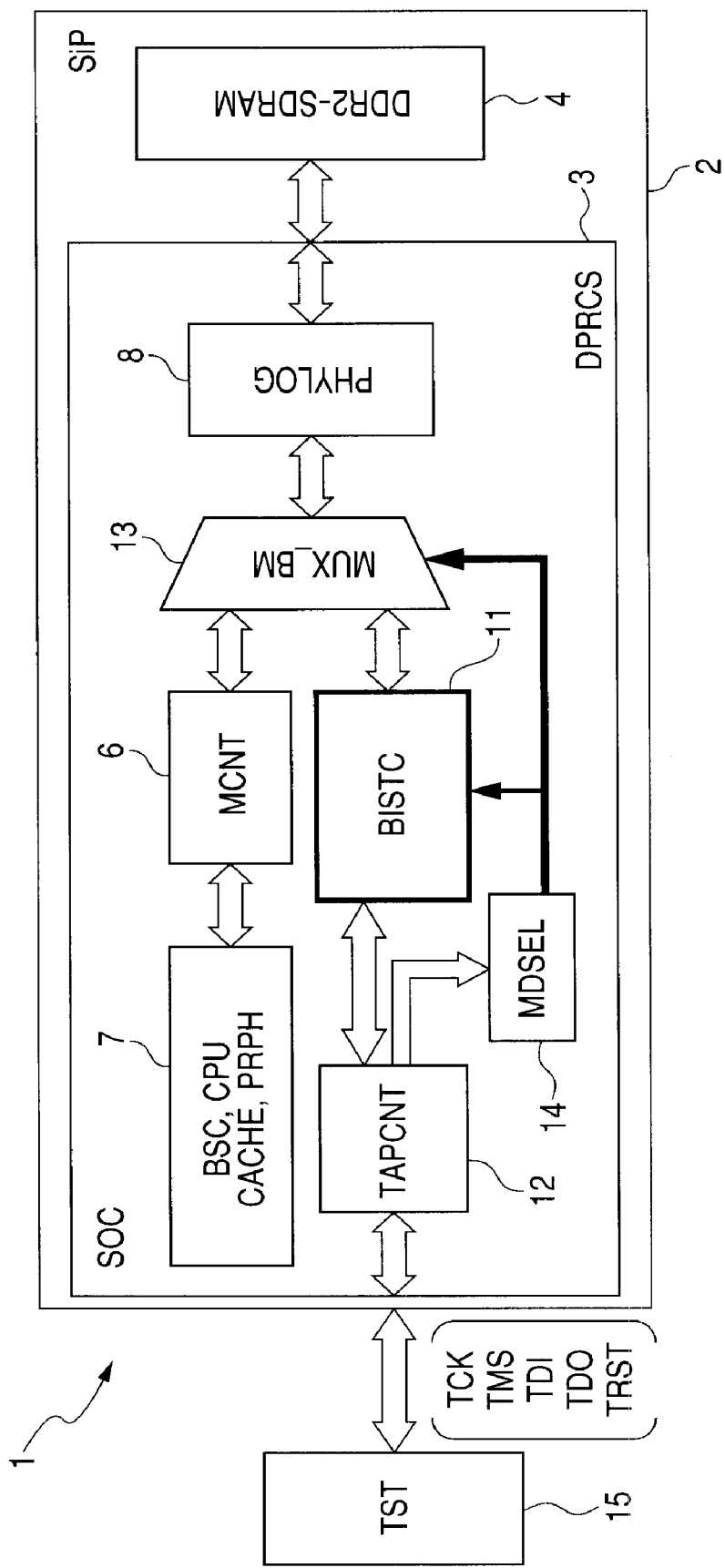
FIG. 1 is a block diagram illustrating a semiconductor module as an example of a semiconductor device according to the present invention.

First, the outline of representative embodiments of the present invention will be described. In the outline description of representative embodiments, parenthesized reference numerals for the accompanying drawings are given only to illustrate the concepts of elements therewith.

[1] A semiconductor device according to a representative embodiment of the present invention includes a memory interface (8) capable of being coupled to an external memory (4), a processing unit for performing data processing including data processing based on data of the external memory, a built-in self-test circuit (11) for generating a test signal for testing the external memory, a multiplexer (13) for switchably coupling the processing unit or the built-in self-test circuit to the memory interface, and a terminal to which a signal for instructing the multiplexer to switch between the processing unit and the built-in self-test circuit is inputted. With this, the content of self-testing is not limited by the function of the processing unit.

According to one specific mode, the terminal is coupled to the multiplexer through an IEEE1149.1-compliant TAP controller to control the built-in self-test circuit and refer to a test result.

According to another specific mode, the terminal is coupled to the built-in self-test circuit through the TAP controller. With this, the built-in self-test circuit can generate an address, data, and a command for a memory test, in response to an instruction according to the specification of the memory to be tested, from the TAP controller.

According to another specific mode, the processing unit includes a logic circuit which can be an access requesting entity for the external memory and a memory controller for controlling the external memory in response to an access request from the logic circuit, and the built-in self-test circuit programmably generates an address, data, and a command for a memory test in accordance with an instruction inputted through the TAP controller and outputs them through the memory interface, and can compare data read from the external memory with expected data. With this, the content of self-testing is not limited by the function of the memory controller. The built-in self-test circuit can generate an address, data, and a command for a memory test, in response to an instruction according to the specification of the memory to be tested, from the TAP controller. Therefore, the individual design change of the BIST circuit in accordance with the difference of the specification of the memory to be tested can be reduced, which can facilitate the broad adaptation of the BIST circuit and contribute to a reduction in test design cost.

According to another specific mode, the built-in self-test circuit enables an address strobe signal and establishes an address signal before a command input enable (csi_n=0). For example, the built-in self-test circuit enables a row address strobe signal (ras_n=0) and establishes a row address signal before a row-address command input enable (csi_n=0), and enables a column address strobe signal (cas_n=0) and establishes a column address signal before a column-address command input enable (csi_n=0). With this, it is possible to ease temporal constraints in which the address strobe signals have to be enabled at the same time as the command input enables, thus making it easier to secure setup times for the address strobe signals and the address signals. Consequently, it is possible to prevent a test result from being incorrect by the influence of noise etc., which can provide a test result with high reliability.

According to another specific mode, the built-in self-test circuit has output terminals of a plurality of pairs of command input enable signals and clock enable signals which are selectively made valid along with an address, data, and a data strobe signal, and a plurality of external memories which receive an address, data, and a data strobe signal in common are selectively made operable. With this, it is possible to easily deal with usage by the so-called rank switching for selectively accessing a plurality of memories. According to another specific mode, the built-in self-test circuit can select a high level or a low level of an initial value of a clock enable signal. Thereby, it is possible to easily deal with the difference between memory specifications for the clock enable signal.

According to another specific mode, the built-in self-test circuit includes a plurality of command tables (DECTBL_1 to DECTBL_3) for converting a command (BCMD) of a predetermined command set into a command (MCMD) of a memory command set according to a specification of the external memory, and a multiplexer (36_MUX) can select an output of the command tables in accordance with a selection signal outputted from a command table. In the case of dealing with the command specifications of various external memories, it is possible to reduce the number of bits of the command of the predetermined command set, which can contribute to a reduction in the circuit size of the built-in self-test circuit.

According to another specific mode, the built-in self-test circuit includes a comparison determination circuit (38) for comparing data read from the external memory with expected data read through the TAP controller and successively overwrite-storing memory access information (fail information) pertaining to a comparison determination result of a mismatch until the number of mismatches of comparison determination results reaches a specified number. With this, the acquisition timing of the fail information that can be acquired without being overwritten can be specified by the number of fails. Accordingly, for example, by shifting and setting the acquisition timing of the fail information that can be acquired without being overwritten, it becomes easier to identify a failure analysis and a failure cause.

According to another specific mode, the comparison determination circuit includes a comparison circuit (38B) for comparing data read from the external memory with expected data read through the TAP controller and an input selection circuit (38E) for allowing the same data to be selectively inputted to both an expected data input terminal and a read data input terminal of the comparison circuit. With this, by inputting the expected data to both the expected data input terminal and the read data input terminal of the comparison circuit through the input selection circuit, self-testing can be performed in advance on the comparison circuit, thus making it easy to ensure the reliability of the comparison result of the comparison circuit.

According to another specific mode, the built-in self-test circuit programmably generates and outputs an address, data, and a command for a memory test, and can generate and output pseudorandom numbers as the address and the data for the memory test. With this, the pattern of the address and data for the memory test can easily and pseudoly be made an infinite loop, which can enhance test efficiency.

According to another specific mode, the semiconductor device is formed in one semiconductor chip separate from the external memory. For example, the semiconductor device is configured as a system-on-chip data processor.

According to another specific mode, the semiconductor device includes the external memory formed in another semiconductor chip, and is overall sealed with resin into a module. For example, the semiconductor device is configured as a system-in-package semiconductor module having a system-on-chip data processor and a memory chip.

According to another specific mode, the external memory is a clock synchronous type DRAM (e.g., DDR2-SDRAM) for performing data input/output operation with an outside in synchronization with rising edge and falling edge of a clock signal.

[2] A semiconductor device according to another aspect includes an external memory and a data processor coupled to the external memory. The data processor includes a memory interface coupled to the external memory, an access requesting entity, a memory controller for controlling the external memory in response to an access request from the access requesting entity, a built-in self-test circuit for use in testing the external memory, an IEEE1149.1-compliant TAP controller for controlling the built-in self-test circuit and referring to a test result, and a multiplexer for switchably coupling the memory controller or the built-in self-test circuit to the memory interface. The built-in self-test circuit programmably generates and outputs an address, data, and a command for a memory test in accordance with an instruction inputted through the TAP controller, and can compare data read from the external memory with expected data. The multiplexer selects the built-in self-test circuit in accordance with control information externally inputted through the TAP controller.

For example, the external memory and the data processor are formed in mutually different semiconductor chips. For example, the external memory and the data processor are mounted on a module board and sealed with resin, with an external interface terminal of the data processor being exposed, in a semiconductor module (1).

[3] A semiconductor device according to another aspect, which is overall sealed with resin, includes a memory interface to which a memory can be externally coupled, a logic circuit which can be an access requesting entity, a memory controller for controlling the memory in response to an access request from the logic circuit, a built-in self-test circuit for use in testing the memory, an IEEE1149.1-compliant TAP controller for controlling the built-in self-test circuit and referring to a test result, and a multiplexer for switchably coupling the memory controller or the built-in self-test circuit to the memory interface. The built-in self-test circuit programmably generates and outputs an address, data, and a command for a memory test in accordance with an instruction inputted through the TAP controller, and can compare data read from the memory with expected data. The multiplexer selects the built-in self-test circuit in accordance with control information externally inputted through the TAP controller.

2. Details of Embodiments

Embodiments will be described in greater detail below.

FIG. 1 illustrates a semiconductor module as an example of a semiconductor device according to the invention. In the semiconductor module 1 shown in FIG. 1, a data processor 3 and a DDR2-SDRAM (double data rate 2-synchronous DRAM) 4 are mounted on a module board 2 having multiple external connection electrodes such as solder bump electrodes on the back side, and the surface is sealed with resin.

The data processor 3 is configured as a semiconductor integrated circuit in SOC (system-on-chip) form such as a microcomputer. In FIG. 1, a circuit configuration for self-testing the DDR2-SDRAM 4 is shown in detail.

The DDR2-SDRAM 4 is coupled with a physical interface 8 of the SOC through wiring and electrodes coupled to the SOC.

Further, in the SOC, a memory controller (MCNT) 6 and a circuit block 7 are representatively shown as a circuit configuration for original data processing of the data processor 3. The memory controller (MCNT) 6 and the circuit block 7 are an example of the processing unit. The circuit block 7 includes a central processing unit (CPU) for fetching and executing instructions, a cache memory (CACHE) for storing frequently-accessed data and instructions in a state of being outputtable by associative retrieval, a bus state controller (BSC) for performing bus control according to an address area to be accessed from the CPU or the like, and a peripheral circuit (PRPH) such as a timer coupled to the BSC through a peripheral bus. The memory controller 6 is one of the peripheral circuits and controls an external memory in response to an access request from the CPU or the like. The memory controller 6 performs, for example, command output control, refresh control, and address output control address-multiplexed in synchronization with a RAS (row address strobe) and a CAS (column address strobe) to the DDR2-SDRAM 4. The data processor 3 includes the physical interface (PHYLOG) 8 according to the physical interface specification of the DDR2-SDRAM 4, and the DDR2-SDRAM 4 is coupled to the memory controller 6 through the physical interface 8. The physical interface 8 is a circuit that satisfies a physical layer specification of the external interface of the DDR2-SDRAM 4. The physical interface 8 of the DDR2-SDRAM 4 includes circuits for the differential output of a clock signal, the differential input/output of a data strobe signal, and data input/output. In the case of a DDR-SDRAM, the physical interface thereof does not need to perform the differential input/output of a data strobe signal. The circuit configuration of the physical interface is uniquely determined by the specification of an external memory to be used.

A configuration for self-testing the DDR2-SDRAM 4 includes a built-in self-test circuit (BISTC) 11, an IEEE1149.1-compliant TAP controller (TAPCNT) 12 for controlling the built-in self-test circuit 11 and referring to a test result, a multiplexer (MUX_BM) 13 for switchably coupling the memory controller 6 or the built-in self-test circuit 11 to the physical interface 8, and an operation mode selection circuit (MDSEL) 14 for the multiplexer 13 and the built-in self-test circuit 11. When a test with the BISTC 11 is performed, a tester (TST) 15 is coupled to the TAPCNT 12.

Figure 2:
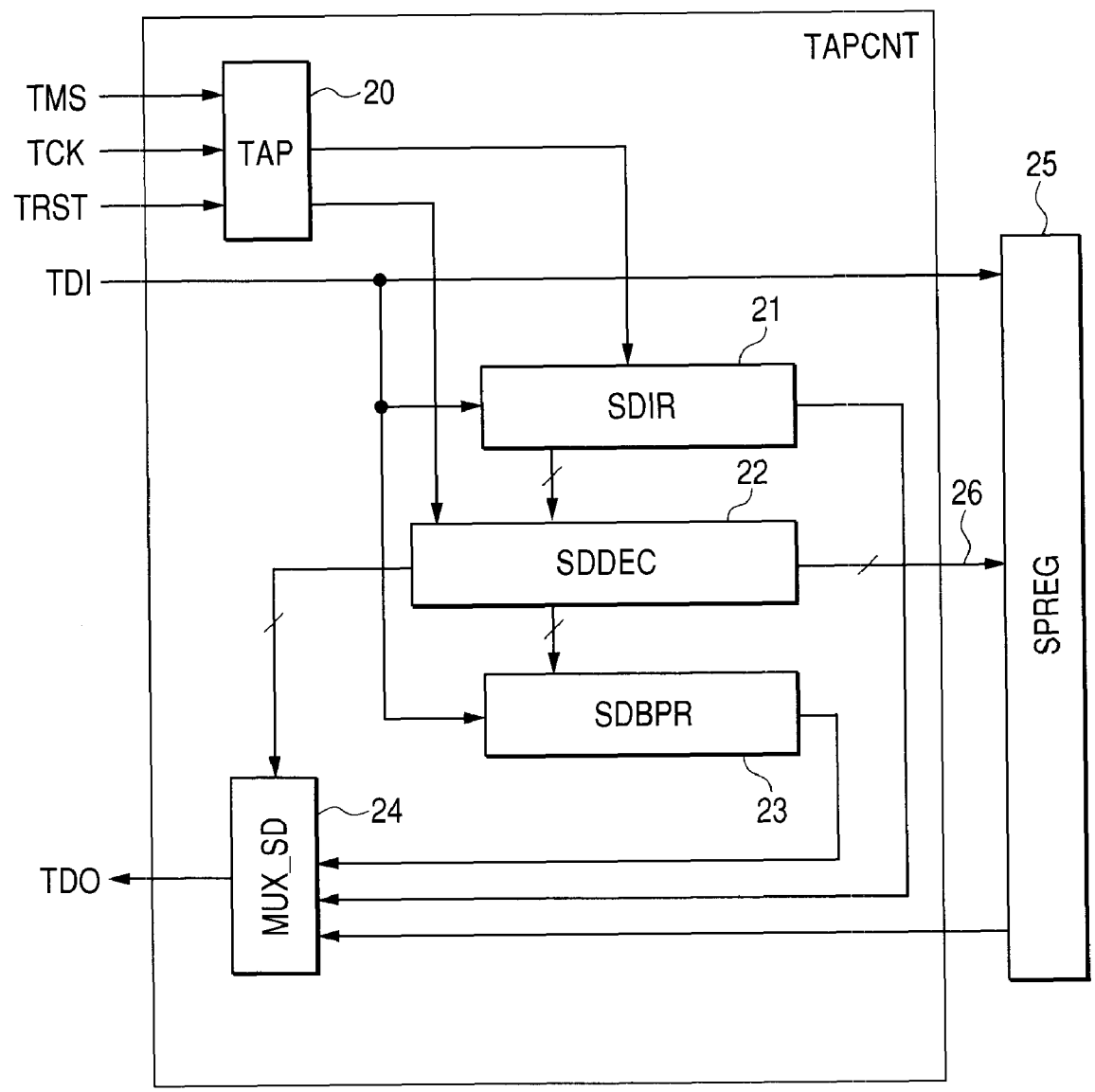
FIG. 2 is a block diagram illustrating the details of a TAPCNT.

FIG. 2 illustrates the details of the TAPCNT 12. The TAPCNT 12 includes a test access point (TAP) 20, a command register (SDIR) 21, a decoder (SDDEC) 22, a bypass register (SDBPR) 23, and a multiplexer (MUX_SD) 24. The TAPCNT 12 has a total of five bits which are a mode terminal TMS, a clock terminal TCK, a reset terminal TRES, a data input terminal TDI, and a data output terminal TDO. These terminals are coupled to the tester 15 during self-testing. In synchronization with a clock signal inputted to the clock terminal TCK, the TAPCNT 12 receives data through the data input terminal TDI and outputs data through the data output terminal TDO. A value at the mode terminal TMS allows this change in synchronization with the clock signal inputted to the clock terminal TCK, thereby determining the meaning of data inputted through the input terminal TDI. This protocol conforms to state transition specified in IEEE1149.1, and in accordance therewith, it is determined whether input data is a command or data. Between the data input terminal TDI and the data output terminal TDO is disposed a scan path register circuit (SPREG) 25 formed by coupling a number of scan registers in series. The scan path register circuit 25 has a circuit configuration formed by series-coupling a data register, a control register, and the like disposed in the MDSEL 14 and the BISTC 11 in the form of a shift register in a predetermined order. The decoder 22 decodes a command inputted to the command register 21 to generate a BIST control signal 26. The BIST control signal 26 selects and switches a scan path, and determines whether input data is a command or data. This makes it possible to set data and control information through the data input terminal TDI in the data register, the control register, and the like in the MDSEL 14 and the BISTC 11 constituting the scan path register circuit 25 and retrieve a test result held in the data register etc. through the data output terminal TDO. The output operation of the BISTC 11 is selected through the multiplexer 13 by inverting the selection bit of the control register incorporated in the MDSEL 14 from an initial value via the scan path.

The bypass register 23 is a register for passing data from the data input terminal TDI to the data output terminal TDO. The multiplexer 24 selects a path coupled to the data output terminal TDO.

Figure 3:
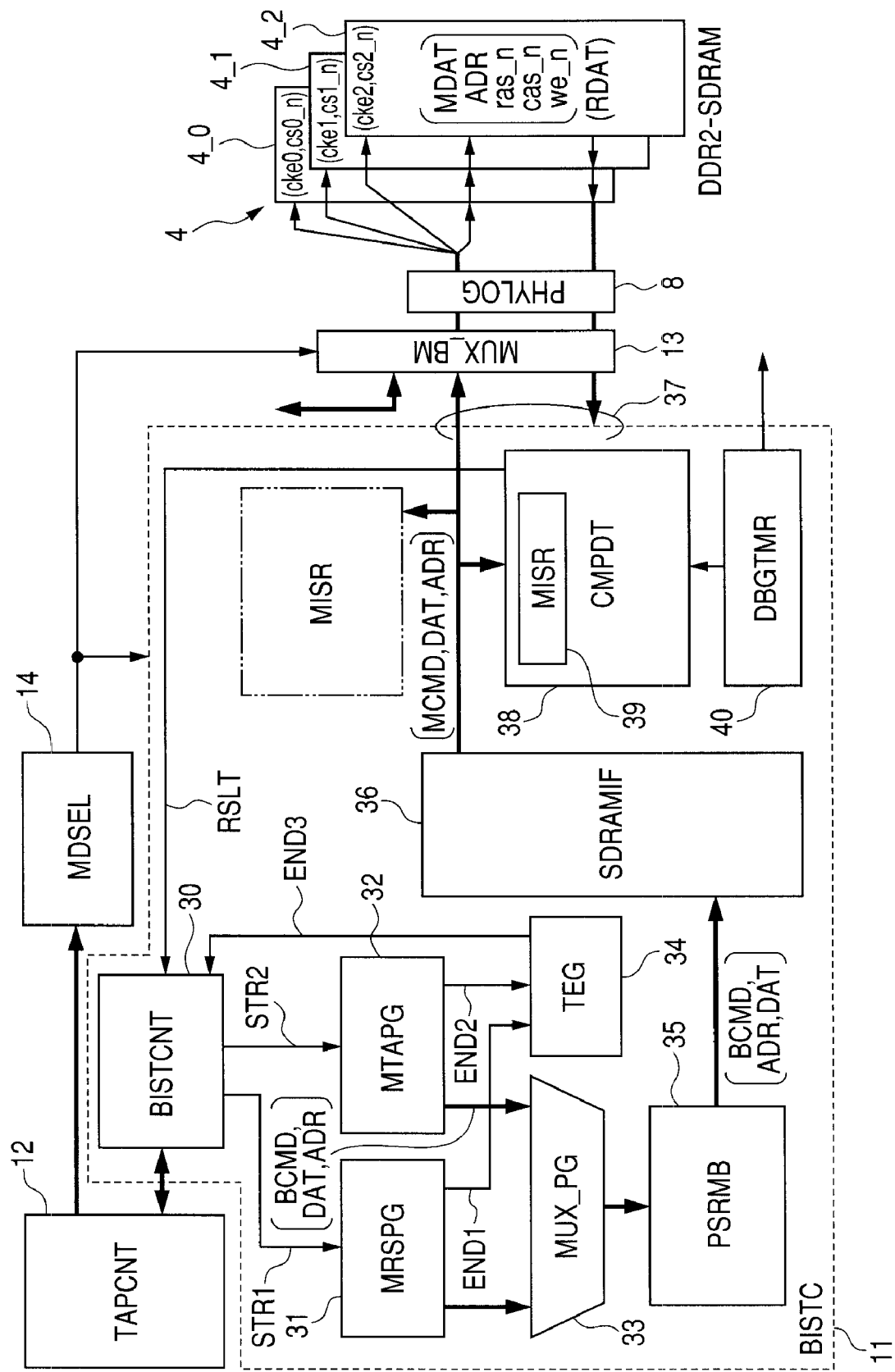
FIG. 3 is a block diagram illustrating, as the details of a BISTC, the path of an address, data, and a command for the access operation of a DDR2-SDRAM by a test pattern and the configuration.
Figure 4:
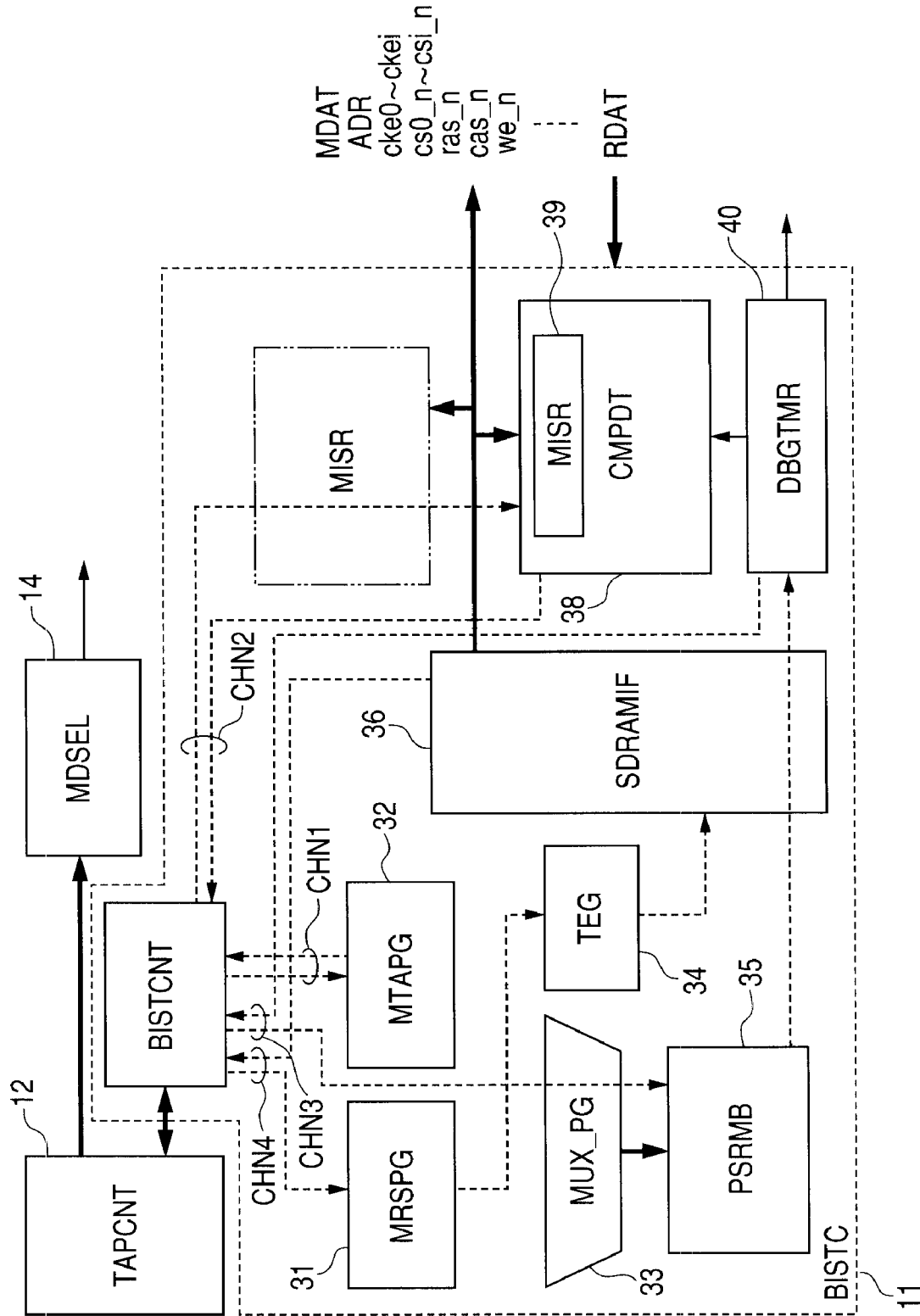
FIG. 4 is a block diagram illustrating, as the details of the BISTC, the configuration in which focus is placed on the connection chain of a scan path with the TAPCNT.

FIGS. 3 and 4 illustrate the details of the BISTC 11. In particular, FIG. 3 illustrates the path of an address, data, and a command for the access operation of the DDR2-SDRAM by a test pattern and the configuration thereof. As described above, the built-in self-test circuit 11 is coupled through the multiplexer 13 and the physical interface (PHYLOG) 8 to the DDR2-SDRAM. In FIG. 4, focus is placed on the connection chain of the scan path with the TAPCNT.

Figure 5:
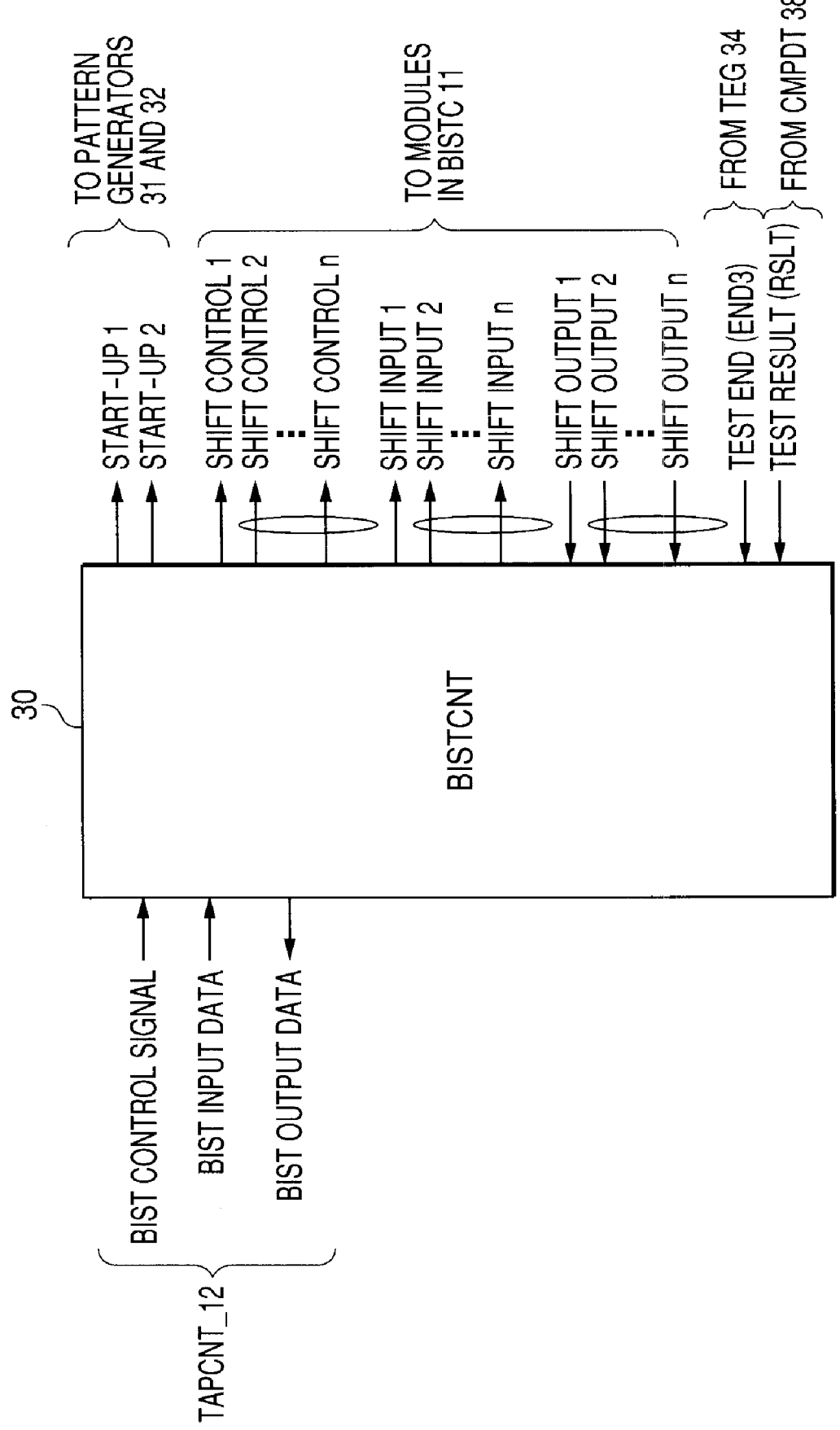
FIG. 5 is a block diagram illustrating the details of input and output signals of a BISTCNT.

The BISTC 11 includes a BIST control circuit (BISTCNT) 30 coupled to the TAPCNT 12. In accordance with input information from the TAPCNT 12, the BIST control circuit 30 controls the selection of a path of the scan path register formed in the BISTC 11, the start and end of a built-in self-test operation (also referred to simply as a test operation), and the collection of a test result. The selectable paths of the scan path register are CHN1 to CHN4 shown in FIG. 1. The registers in the circuits are coupled so as to sequentially shift data in series in synchronization with the clock along the paths indicated by broken lines in FIG. 4. In a test operation, control data etc. from the TAPCNT 12 are first initialized for the circuits of the BISTC 11 before the generation of a test pattern. FIG. 5 illustrates the details of input and output signals of the BIST control circuit 30.

Figure 6:
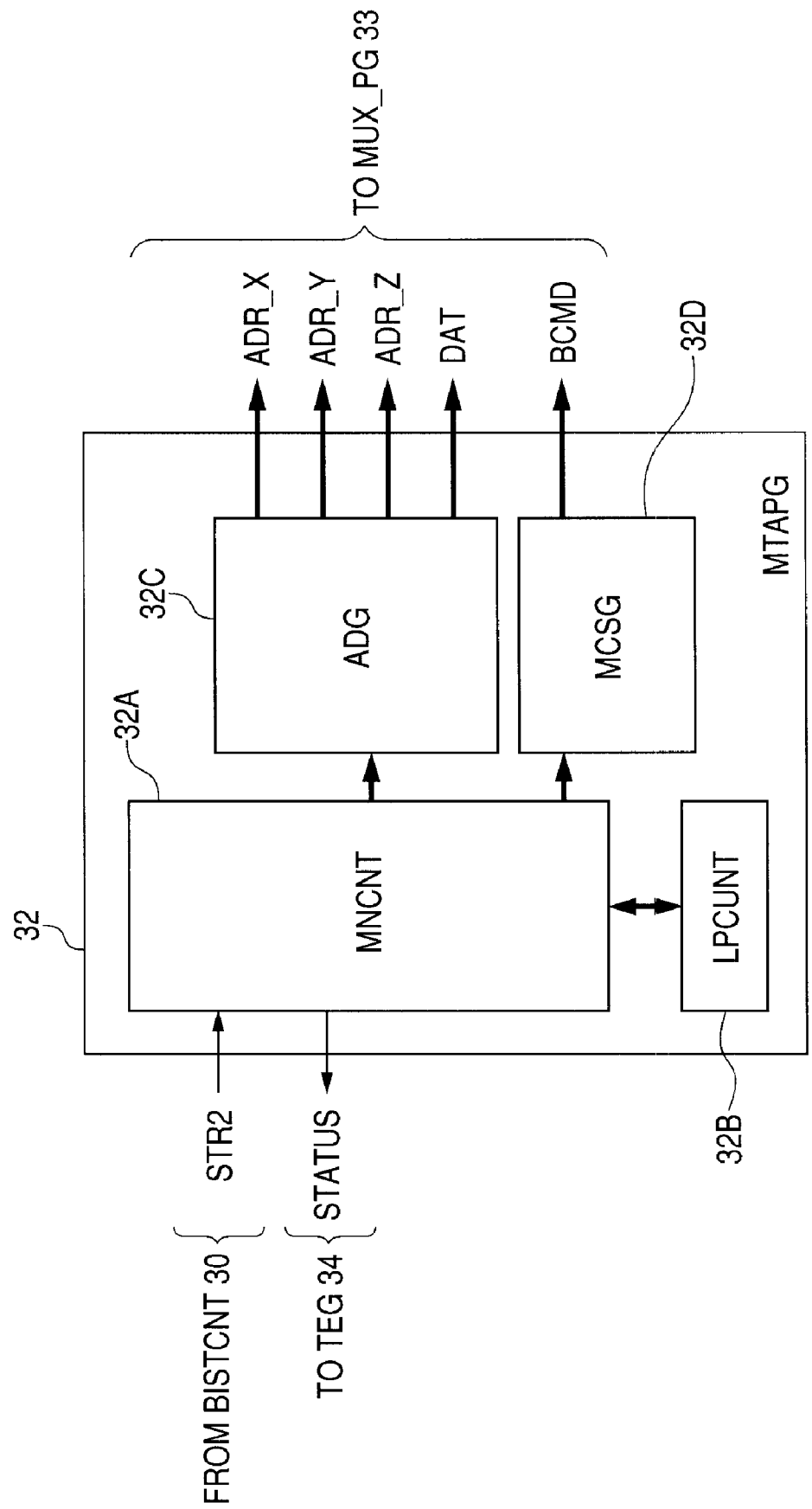
FIG. 6 is a block diagram illustrating the specific configuration of an MTAPG.

There are provided a mode-register pattern generator (MRSPG) 31 and a memory-test-algorithm pattern generator (MTAPG) 32 to generate test patterns. The mode-register pattern generator (MRSPG) 31 generates the pattern of control data to be set in a mode register in the BISTC 11. The memory-test-algorithm pattern generator (MTAPG) 32 sequentially generates an address (ADR), data (DAT), and a BIST command (BCMD) necessary to sequentially perform the test operation of the DDR2-SDRAM in accordance with a predetermined test algorithm. A multiplexer (MUX_PG) 33 selects a generated pattern. First, the mode-register pattern generator (MRSPG) 31 outputs a test pattern in response to a start signal STR1, and then the memory-test-algorithm pattern generator (MTAPG) 32 outputs a test pattern in response to a start signal STR2. For the end of the generation of the test patterns, signals END1 and END2 are conveyed to a test end signal generator (TEG) 34, which provides a test end signal END3 to the BIST control circuit (BISTCNT) 30. FIG. 6 illustrates the specific configuration of the MTAPG 32. In FIG. 6, the MTAPG 32 includes a main controller (MNCNT) 32A for controlling a pattern occurrence, a loop counter (LPCUNT) 32B for use in repeating a pattern occurrence, an address data generator (ADG) 32C for generating addresses (ADR) and data (DAT), and a command sequence generator (MCSG) 32D for generating a BIST command (BCMD). In FIG. 6, a row address ADR_X, a column address ADR_Y, and a bank address ADR_B are illustrated as generated addresses (ADR).

A test pattern outputted from the multiplexer 33 is supplied to a programmable scrambler (PSRMB) 35. The programmable scrambler 35 scrambles the addresses (ADR) and data (DAT), and generates pseudorandom numbers as the addresses and data. An operation to be performed is determined by a mode control data pattern outputted from the mode-register pattern generator (MRSPG) 31 or the memory-test-algorithm pattern generator (MTAPG) 32.

The address (ADR) and data (DAT) scrambled as necessary and the BIST command (BCMD) are inputted to an SDRAM interface control circuit (SDRAMIF) 36. The SDRAMIF 36 decodes the BIST command (BCMD) to generate a memory command (MCMD) for the DDR2-SDRAM, and outputs the memory command (MCMD), the address (ADR), and necessary write data (WDAT) to a memory bus 37 in accordance with predetermined access timing. The DDR2-SDRAM 4 supplies read data to the memory bus 37.

A data comparison determination unit (CMPDT) 38 having a multiple input signature register (MISR) 39 is coupled to the memory bus 37. As shown by a two-dot chain line in FIG. 3, the MISR 39 can be disposed outside the data comparison determination unit (CMPDT) 38.

In a test operation, the data comparison determination unit (CMPDT) 38 compares read data outputted from the DDR2-SDRAM 4 with expected data, and stores fail information such as a command, an address, and data at the occurrence of a mismatch. A test result RSLT is supplied to the BISTCNT 30. In this example, the write data (WDAT) into the memory is used as the expected data, which is therefore not generated as a part of the test pattern. However, expected data can be generated as a part of the test pattern, for an expected data pattern different from the write data (WDAT) may be required depending the content of a test operation.

The MISR 39 compresses the memory command (MCMD), the data (DAT), and the address (ADR) outputted from the SDRAMIF 36, and compares the compressed data with the expected value, thereby making it possible to detect beforehand whether or not there is an abnormality in the BISTC 11.

A debug timer (DBGTMR) 40 is a timer circuit capable of generating a tiger signal for a logic analyzer.

Figure 7:
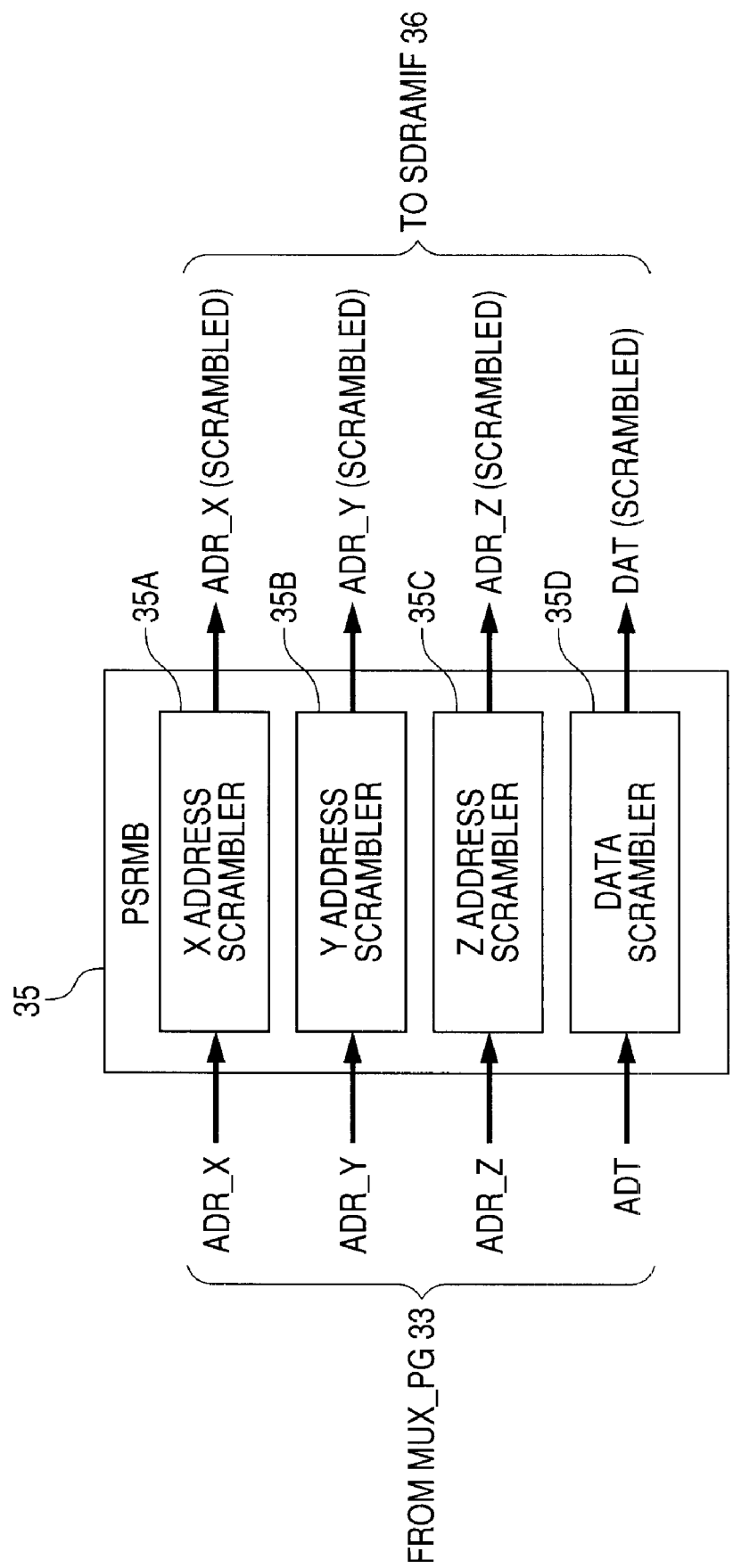
FIG. 7 is a block diagram illustrating the details of a PSRMB.
Figure 8:
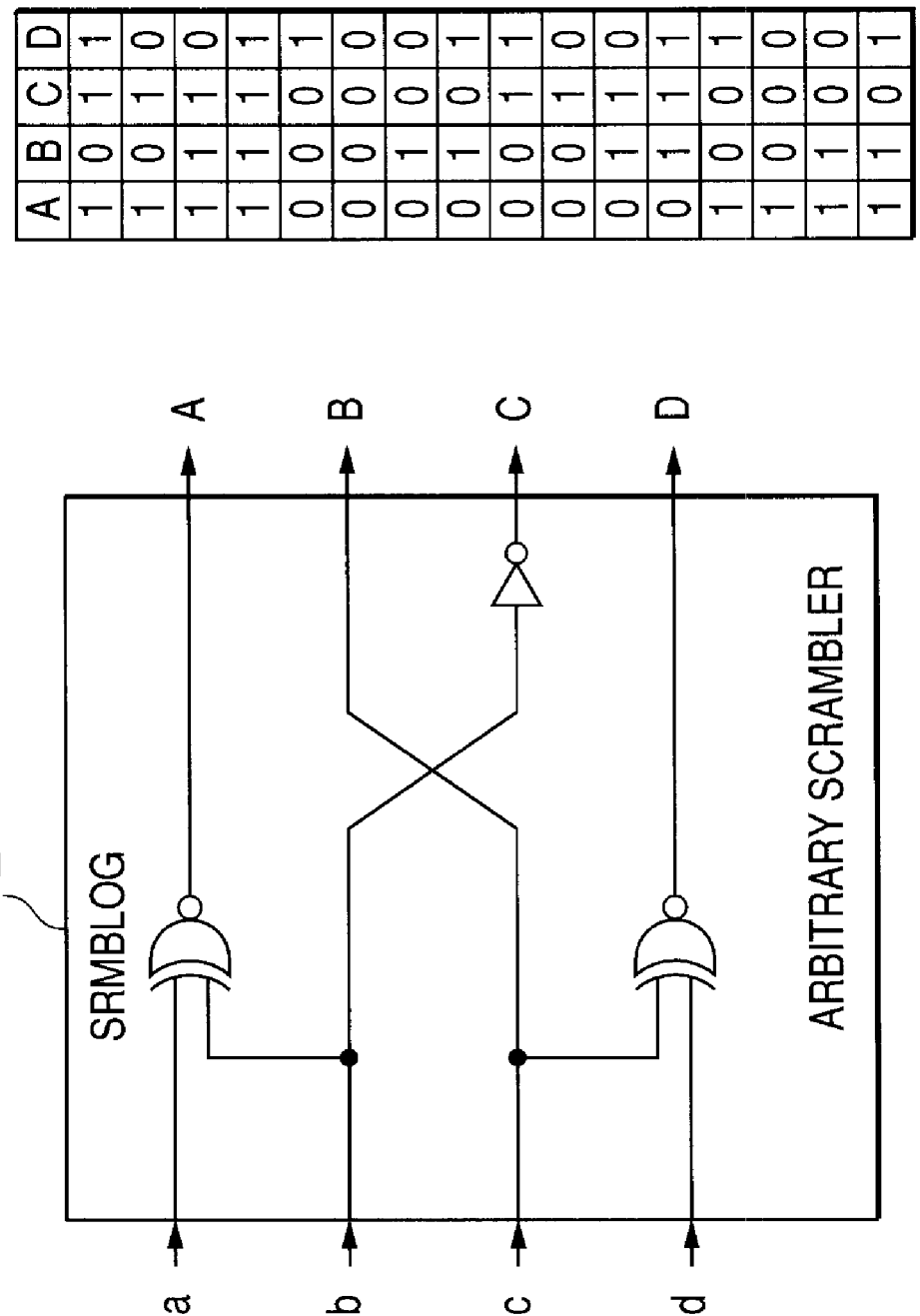
FIG. 8 is a logic circuit diagram illustrating a configuration for allowing scramble circuits to convert addresses and data into pseudorandom numbers.

FIG. 7 illustrates the details of the PSRMB 35. The PSRMB 35 includes, for example, a scramble circuit 35A for scrambling the row address ADR_X, a scramble circuit 35B for scrambling the column address ADR_Y, a scramble circuit 35C for scrambling the bank address ADR_B, and a scramble circuit 35D for scrambling the data DAT. The scramble circuits 35A to 35D can convert addresses and data into pseudorandom numbers for output. For example, as shown schematically in FIG. 8, pseudorandom number outputs A, B, C, and D can be generated from 4-bit inputs a, b, c, and d by an arbitrary scramble logic (SRBMLOG) 35_LOG. The scramble circuits 35A to 35D have not only the arbitrary scramble logic (SRBMLOG) 35_LOG but also other scramble logics for selection of a scramble necessary for a required memory test in accordance with the configuration of the address mapping of the DDR2-SDRAM memory array, thus making it possible to select a required scramble logic in accordance with control information set through the TAPCNT 12.

By having the arbitrary scramble logic (SRBMLOG) 35_LOG, the pattern of the address and data for a memory test can easily and pseudoly be made an infinite loop, which can enhance test efficiency.

Figure 9:
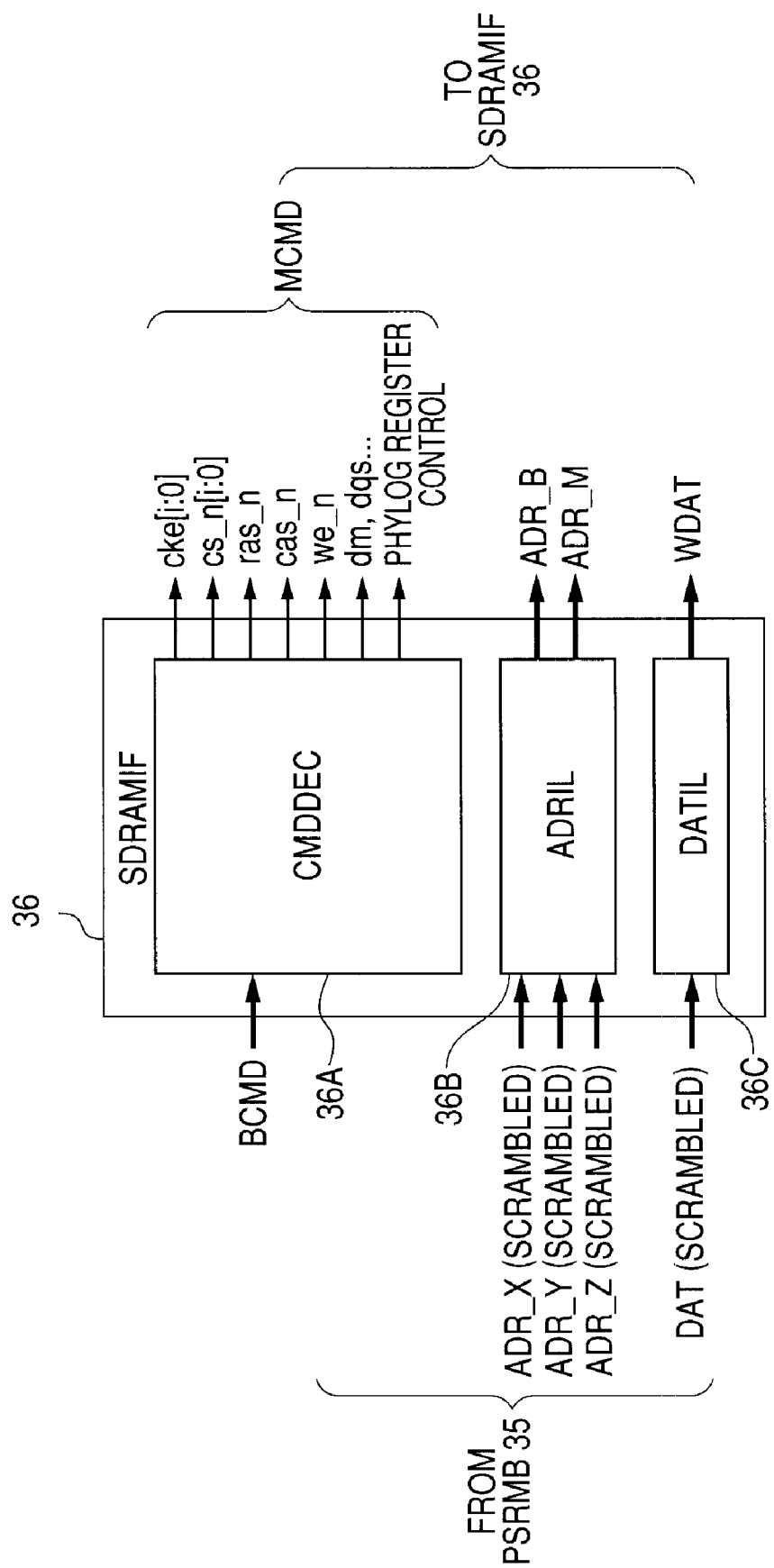
FIG. 9 is a block diagram illustrating the details of an SDRAMIF.

FIG. 9 illustrates the details of the SDRAMIF 36. The SDRAMIF 36 includes a command decoder (CMDDEC) 36A for generating a memory command MCMD from the BIST command BCMD as an input code, an address alignment circuit (ADRIL) 36B for aligning the addresses ADR_X, ADR_Y, and ADR_Z outputted from the PSRMB 35 in an arrangement suitable for memory access and outputting them, and a data alignment circuit (DATIL) 36C for aligning the data DAT outputted from the PSRMB 35 in an arrangement suitable for memory write access and outputting it. The command decoder 36A outputs, as the memory command MCMD, an (i+1)-bit clock enable signal cke[i:0], an (i+1)-bit command input enable signal cs_n[i:0], a 1-bit row address strobe signal ras_n, a 1-bit column address strobe signal cas_n, a 1-bit write enable signal we_n, a data mask signal dm, a data strobe signal dqs, and PHYLOG control information. The PHYLOG control information instructs the PHYLOG 8 to generate differential data strobe signals DQS and DQS_n from the data strobe signal dqs.

Among the command signals outputted from the command decoder 36A, the clock enable signal cke and the command enable signal cs_n indicating the validity of a command supplied from the outside are generated in a set of i+1, and the row address strobe signal ras_n, the column address strobe signal cas_n, the write enable signal we_n, the data strobe signal dqs, and the like are generated in a set of one. With this, the clock enable signal cke and the command enable signal cs_n are individualized for the DDR2-SDRAM 4 having up to (i+1) ranks receiving the common address, data, and data strobe signals, thereby selectively operating them. FIG. 3 shows an example in which i=2. Thereby, it is possible to easily deal with usage by the so-called rank switching for selectively accessing a plurality of DDR2-SDRAMs.

Figure 10:
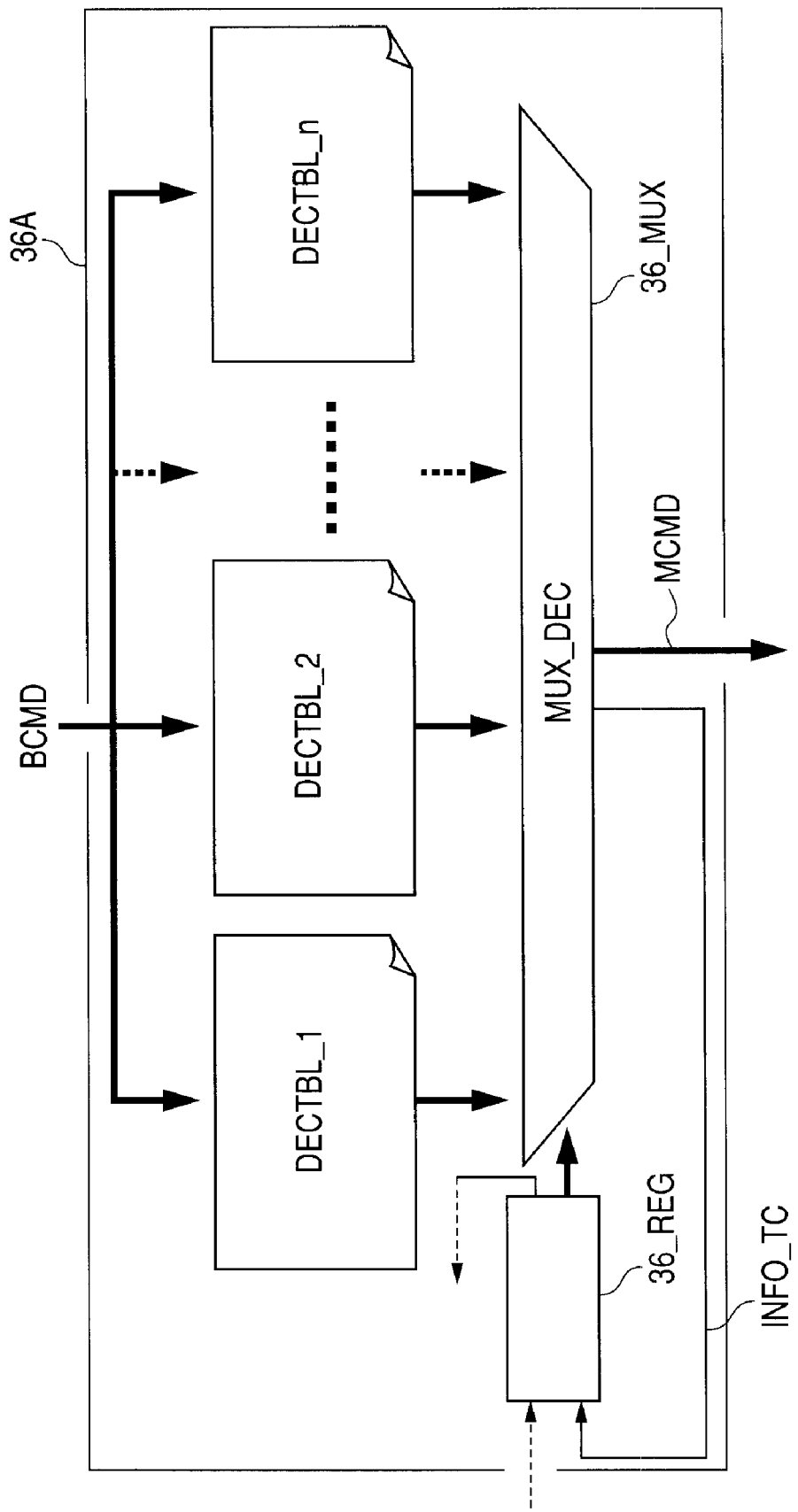
FIG. 10 is a block diagram illustrating the fundamental configuration of a command decoder.

FIG. 10 illustrates the fundamental configuration of the command decoder 36A. The command decoder 36A includes a plurality of command tables DECTBL_1 to DECTBL_n for converting the command BCMD of a BIST command set into the command of a memory command set according to the specification of the DDR2-SDRAM 4. A multiplexer (MUX_DEC) 36_MUX selects an output of the command tables DECTBL_1 to DECTBL_n. The multiplexer 36_MUX makes an initial selection in accordance with control information supplied to a register 36_REG through a scan path from the TAPCNT 12T. Subsequent selections can be made in accordance with select control information (command table switching control information) INFO_TC outputted from a selected command table. In the case of dealing with the command specifications of various DDR2-SDRAMs, it is possible to reduce the number of bits of the command BCMD of the BIST command set, which can contribute to a reduction in the circuit size of the command decoder 36A.

Figure 11:
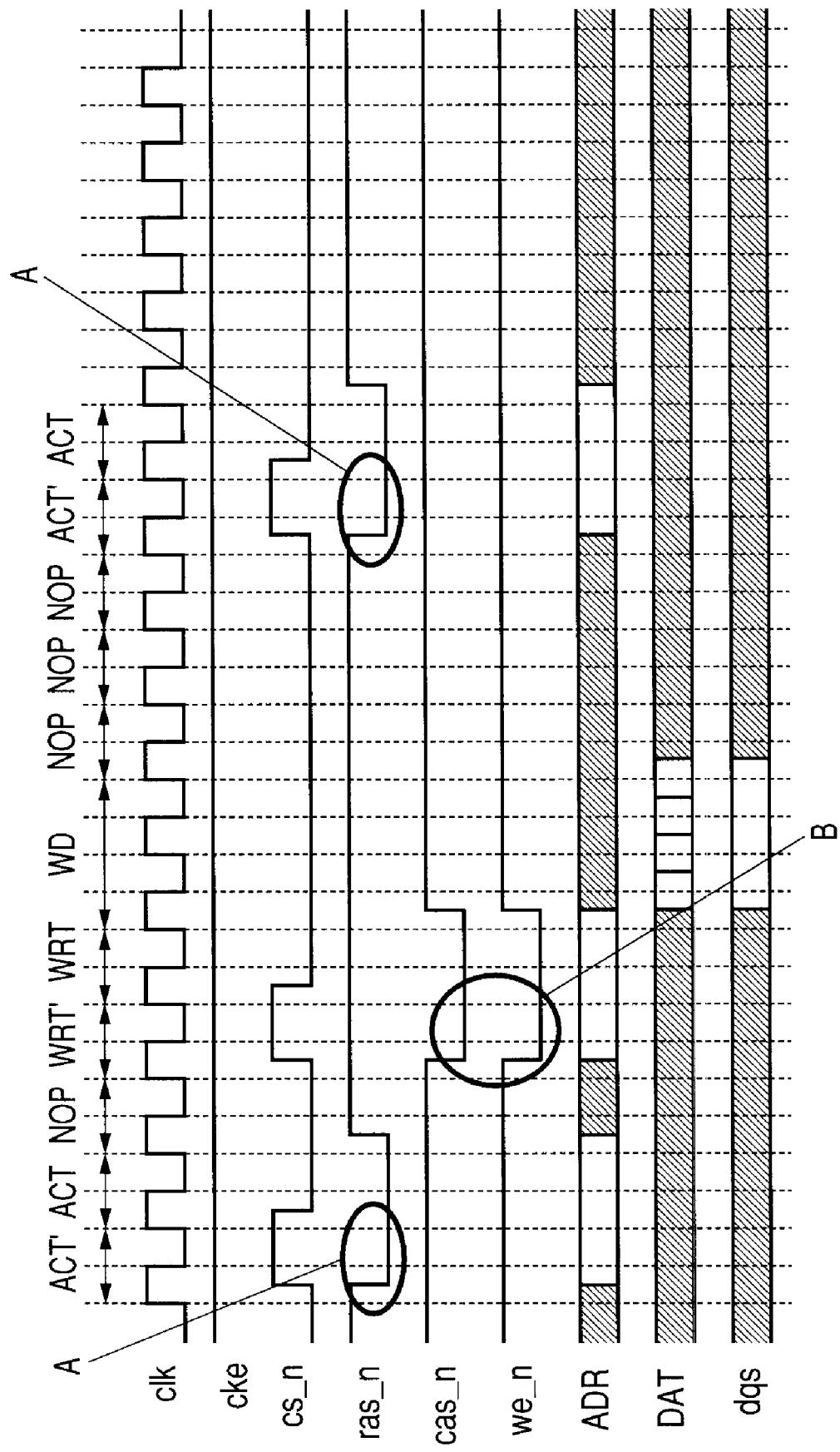
FIG. 11 is a timing chart illustrating the output timing of a memory command by the command decoder.

FIG. 11 illustrates the output timing of the physical interface (PHYLOG) 8 of the memory command MCMD by the command decoder 36A. In FIG. 11, symbols clk, cs_n, ras_n, cas_n, we_n, and dqs are illustrated as command signals. The symbol "clk" denotes a clock signal. Representative commands of the DDR2-SDRAM 4 include an active command (ACT) for operating a row-address circuit and a write command (WRT) for instructing a write operation by specifying a column address. The command decoder 36A previously outputs the active command (ACT) and the write command (WRT) with respect to the JEDEC standard of the DDR2-SDRAM 4. The previously outputted cycles are indicated by ACT' and WRT'. That is, the command decoder 36A enables the address strobe signal ras_n and establishes the address signal ADR before a command enable in which the signal cs_n is a low level. More specifically, the command decoder 36A enables the row address strobe signal ras_n and establishes the row address signal (region A) before a row-address command enable (cs_n=low level), and enables the column address strobe signal cas_n and establishes the column address signal (region B) before a column-address command enable (cs_n=low level). This makes it possible to ease temporal constraints in which the address strobe signals have to be enabled (ras_n=low level, cas_n=low level) at the same time or the same clock cycle as the command enables (cs_n=low level), thus making it easier to secure setup times for the address strobe signals and the address signals. Consequently, it is possible to prevent a test result from being incorrect by the influence of noise etc., which can provide a test result with high reliability.

Figure 12:
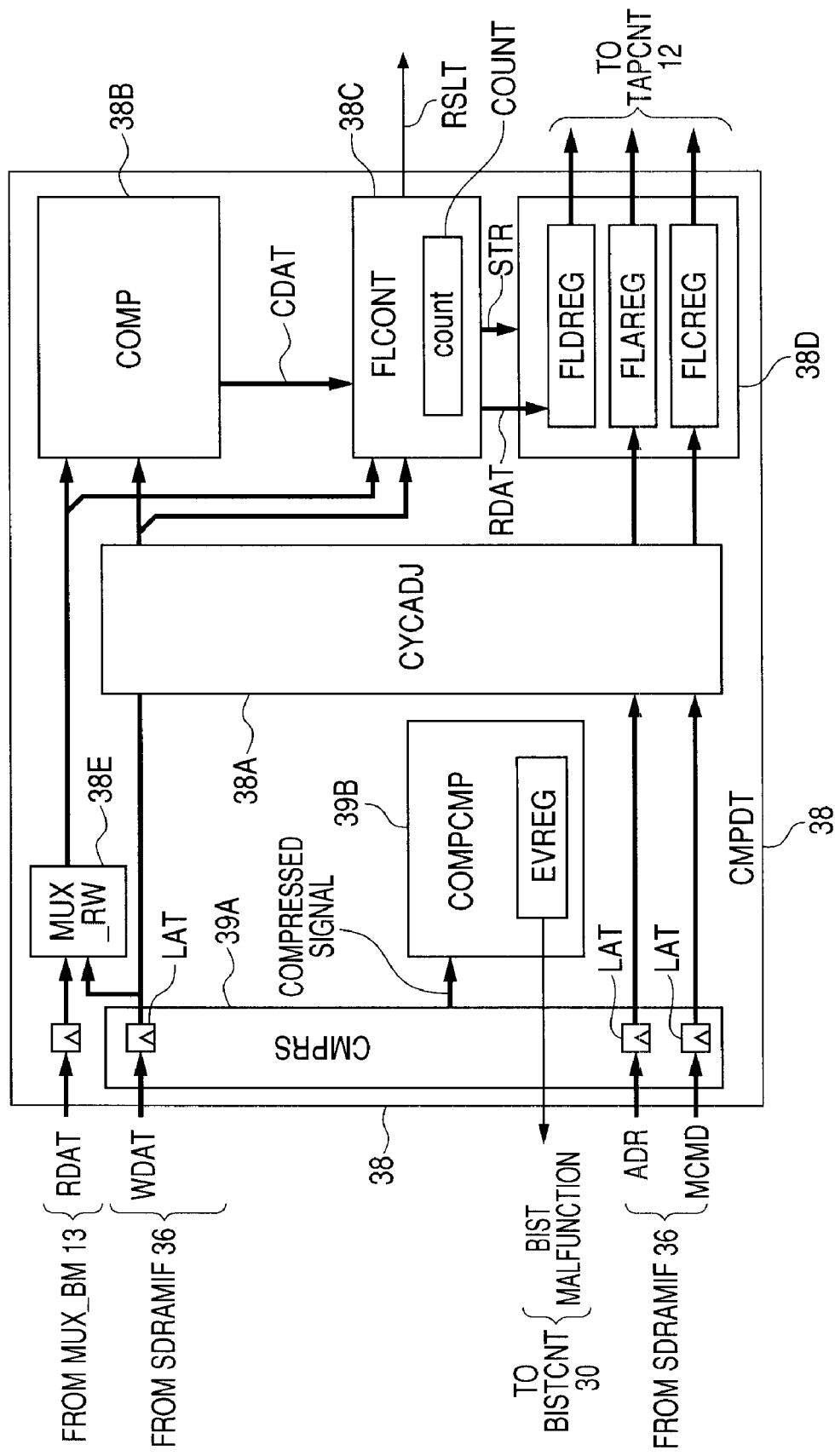
FIG. 12 is a block diagram illustrating the details of a CMPDT.

FIG. 12 illustrates the details of the data comparison determination unit (CMPDT) 38. The write data WDAT, the address ADR, and the command MCMD outputted from the SDRAMIF 36 are temporarily inputted through a latch circuit LAT to a cycle adjustment circuit (CYCADJ) 38A. The cycle adjustment circuit (CYCADJ) 38A outputs the write data WDAT, the address ADR, and the command MCMD to a subsequent stage after the arrival of read data RDAT outputted from the DDR2-SDRAM 4 in response to the command MCMD. A data comparison circuit 38B compares the read data RDAT with the write data WDAT on a cycle-by-cycle basis. Comparison result data CDAT is supplied to a fail information control circuit (FLCONT) 38C. The fail information control circuit (FLCONT) 38C controls a fail register circuit 38D to acquire fail information in accordance with the comparison result. That is, if the comparison result data CDAT indicates a mismatch, comparison data in bits or the read data RDAT of a corresponding memory cycle is stored in a fail data register FLDREG, the address ADR of the memory cycle is stored in a fail address register FLAREG, and the command MCMD of the memory cycle is stored in a fail command register FLCREG. The symbol "STR" denotes a register store signal for the fail registers. The mismatch indicated by the comparison result data CDAT can be notified to the outside through the BISTCNT 30 and the TAPCNT 12, using the test result signal RSLT. The values of the fail registers FLDREG, FLAREG, and FLCREG can be outputted to the outside through the scan path, under the control of the TAPCNT 12.

Figure 13:
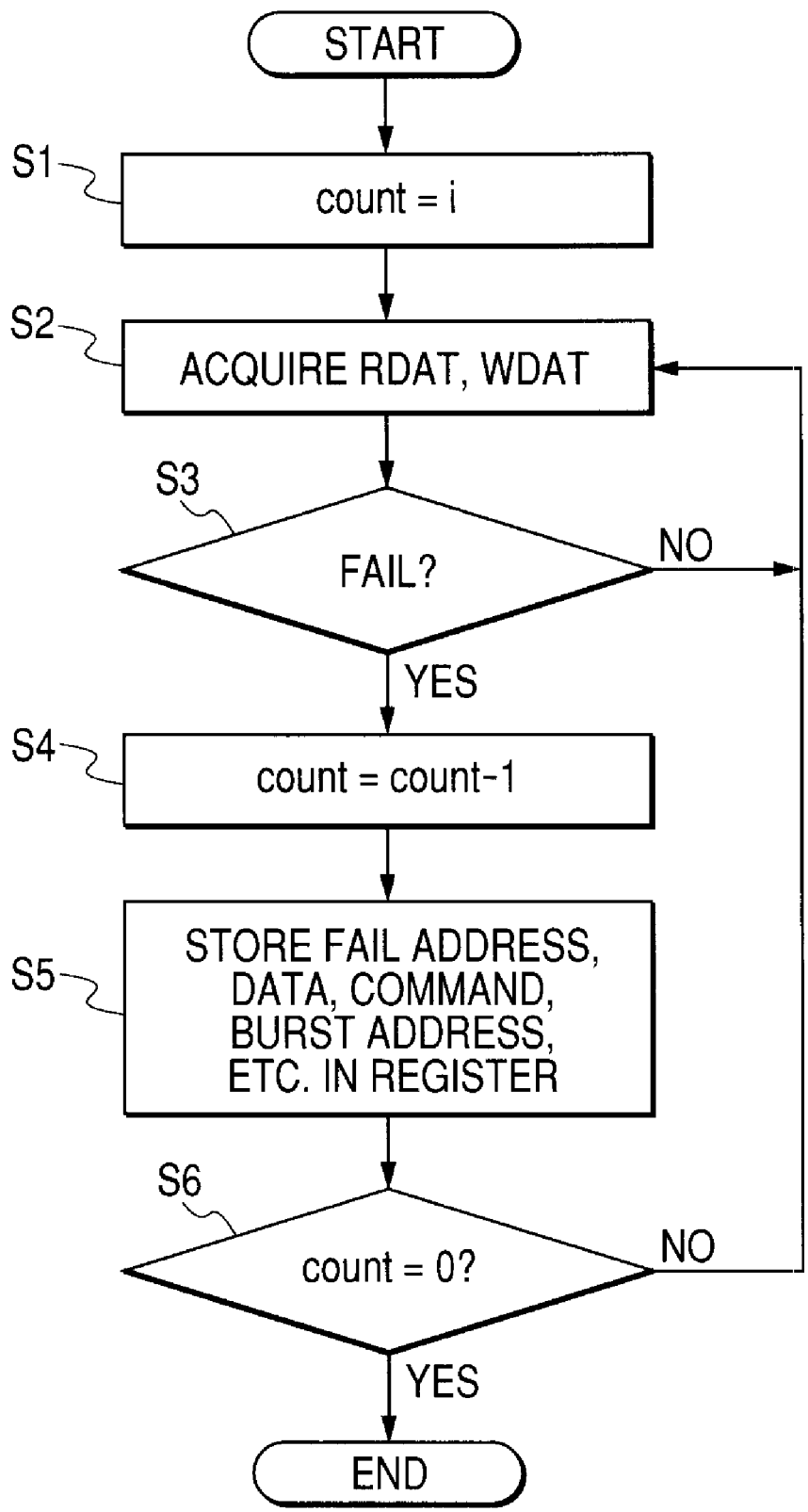
FIG. 13 is a flow chart illustrating the acquisition control of fail information.

The details of fail information acquisition control performed on the fail register circuit 38D will be described. The fail information control circuit 38C includes a counter COUNT for counting the number of mismatches of comparison results indicated by the data CDAT, and updates the fail register circuit 38D by new fail information until the number of mismatches reaches a predetermined number. After that, the fail register circuit 38D is not updated and stores the last fail information. FIG. 13 illustrates the acquisition control flow of fail information. When a test operation is started, a value i is set in a counting register count of the counter COUNT, and read data RDAT and write data WDAT are acquired in each access cycle (S2) and compared (S3). If the comparison result indicates a match, the flow returns to step S2 in the next memory cycle to perform the same processing. If the comparison result indicates a mismatch, the counting register count is decremented by one (S4), and respective data stored in the fail registers of the fail register circuit 38D is updated with the corresponding fail information (S5). After the update, it is determined whether the value of the counting register count is zero (S6). If the value is not zero, the flow returns to step S2 to repeat the above processing until the value of the counting register count becomes zero. When the value of the counting register count becomes zero, the fail information is retained in the fail register circuit 38D, irrespective of whether a new fail occurs thereafter. Thereby, the acquisition timing of the fail information that can be acquired without being overwritten can be specified by the number of fails (i) set in the register count. Accordingly, for example, by shifting and setting the acquisition timing of the fail information that can be acquired without being overwritten, it becomes easier to identify a failure analysis and a failure cause.

As illustrated in FIG. 12, the input path of the write data WDAT can be selectively coupled to the path of the read data by a multiplexer 38E. Control thereof can be performed by control data supplied through the scan path. This allows the data comparison circuit 38B to compare the same write data WDAT inputted thereto. That is, self-testing can be performed in advance on the data comparison circuit 38B, thus making it easy to ensure the reliability of the comparison result of the data comparison circuit 38B.

Figure 14:
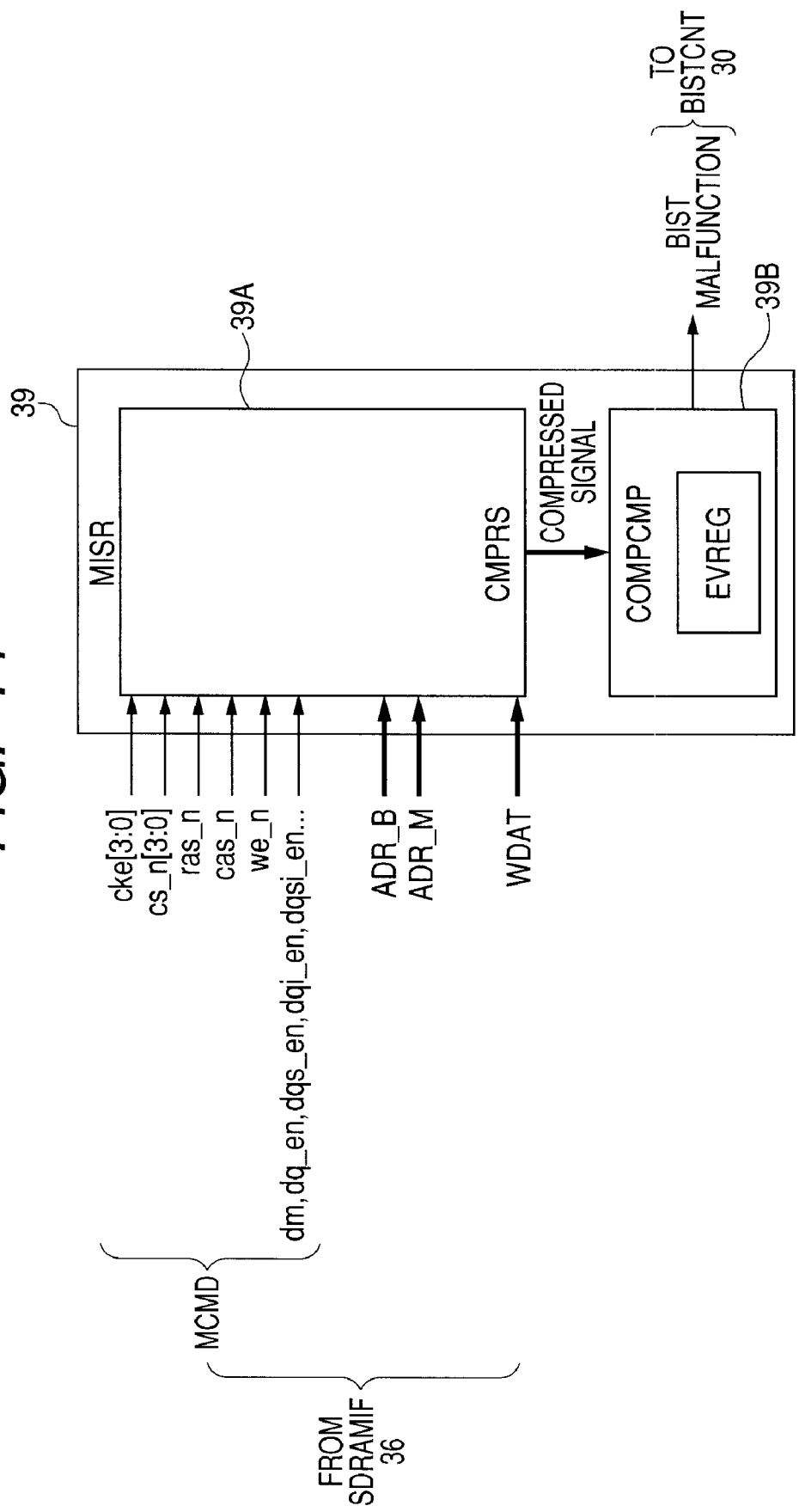
FIG. 14 is a block diagram showing a specific example of an MISR.

The MISR 39 includes a signal compressor (CMPRS) 39A and a compressed-signal comparison determination circuit (COMPCMP) 39B as illustrated in FIG. 14. The signal compressor (CMPRS) 39A receives and compresses the memory command MCMD, the write data WDAT, and the address ADR through the latch circuit via the bus 37, and supplies the compressed signal to the compressed-signal comparison determination circuit 39B. The compressed-signal comparison determination circuit 39B compares the input compressed data with an expected value of an expected value register EVREG to detect an abnormality of circuits from input to the SDRAMIF 36. The expected value is set beforehand in the expected value register EVREG through the scan path. Before a memory test by the BISTC 11, it can be detected beforehand whether or not there is an abnormality in the BISTC 11. If the MISR 39 is disposed in the data comparison determination unit (CMPDT) 38, the latch circuit LAT can be shared therebetween. If the MISR 39 is disposed separately from the data comparison determination unit (CMPDT) 38, a latch circuit or a register different from the latch circuit LAT in the data comparison determination unit (CMPDT) 38 needs to be disposed in the MISR 39. Disposing the MISR 39 in the data comparison determination unit 38 contributes to a reduction in circuit size.

FIG. 14 shows a specific example of the MISR 39. The MISR 39 includes the signal compressor (CMPRS) 39A and the compressed-signal comparison determination circuit (COMPCMP) 39B. The signal compressor (CMPRS) 39A compresses the memory command MCMD, the write data WDAT, and the address ADR via the bus 37, and supplies the compressed signal to the compressed-signal comparison determination circuit 39B. The compressed-signal comparison determination circuit 39B compares the input compressed data with the expected value of the expected value register EVREG to detect an abnormality of circuits from input to the SDRAMIF 36. The expected value is set beforehand in the expected value register EVREG through the scan path. Before a memory test by the BISTC 11, it can be detected beforehand whether or not there is an abnormality in the BISTC 11.

Figure 15:
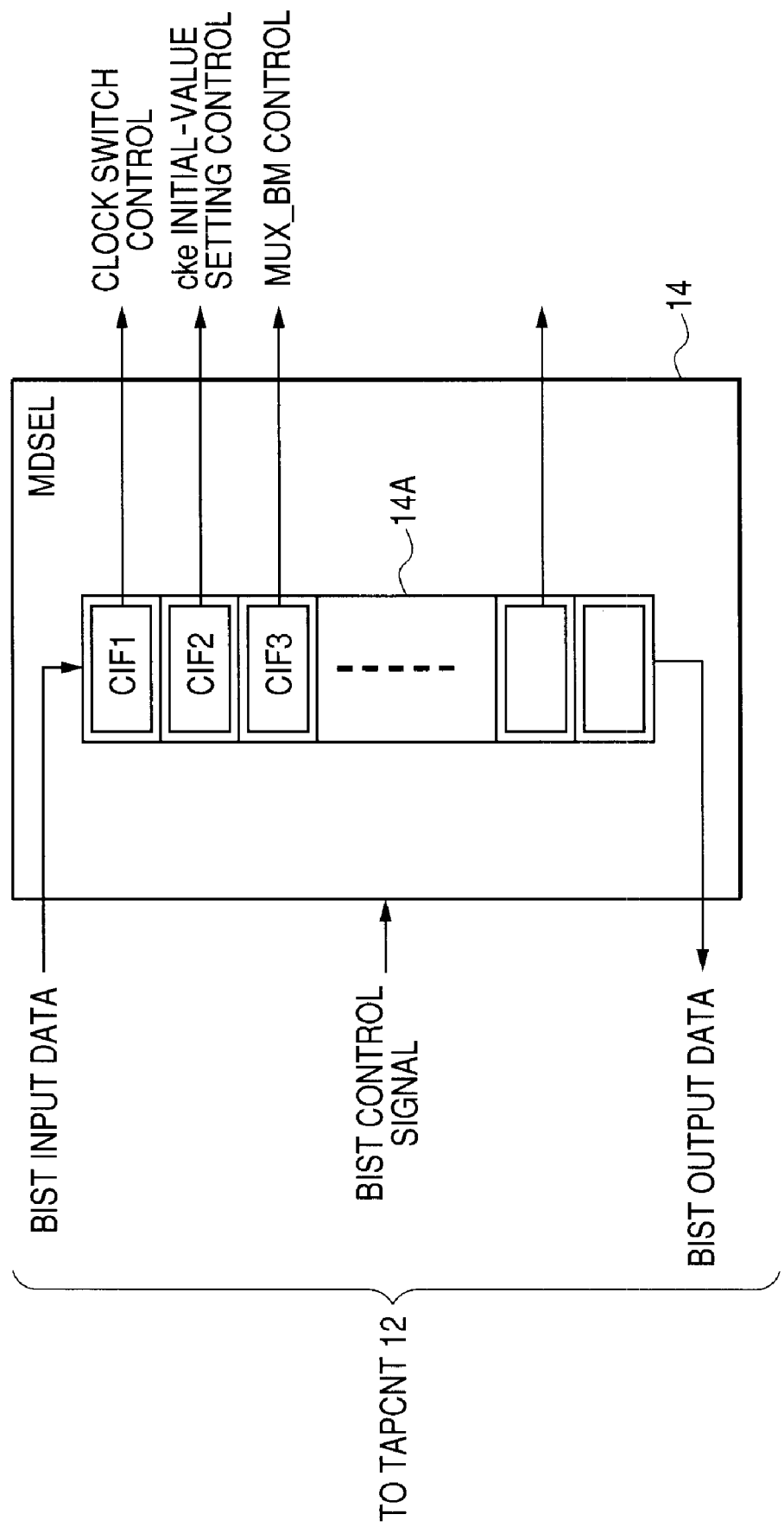
FIG. 15 is a block diagram showing an example of an MDSEL.

FIG. 15 shows an example of the MDSEL 14. The MDSEL 14 includes a control register 14A disposed in the scan path. In control register 14A, a bit CIF1 denotes a clock switching control bit; CIF2, a cke initial-value control bit; and CIF3, a MUX_BM switching control bit.

The clock switching control bit CIF1 enables the switching of the clock clk of the DDR2-SDRAM 4, and selects the real clock of the data processor 3 or an external clock for testing.

Figure 16:
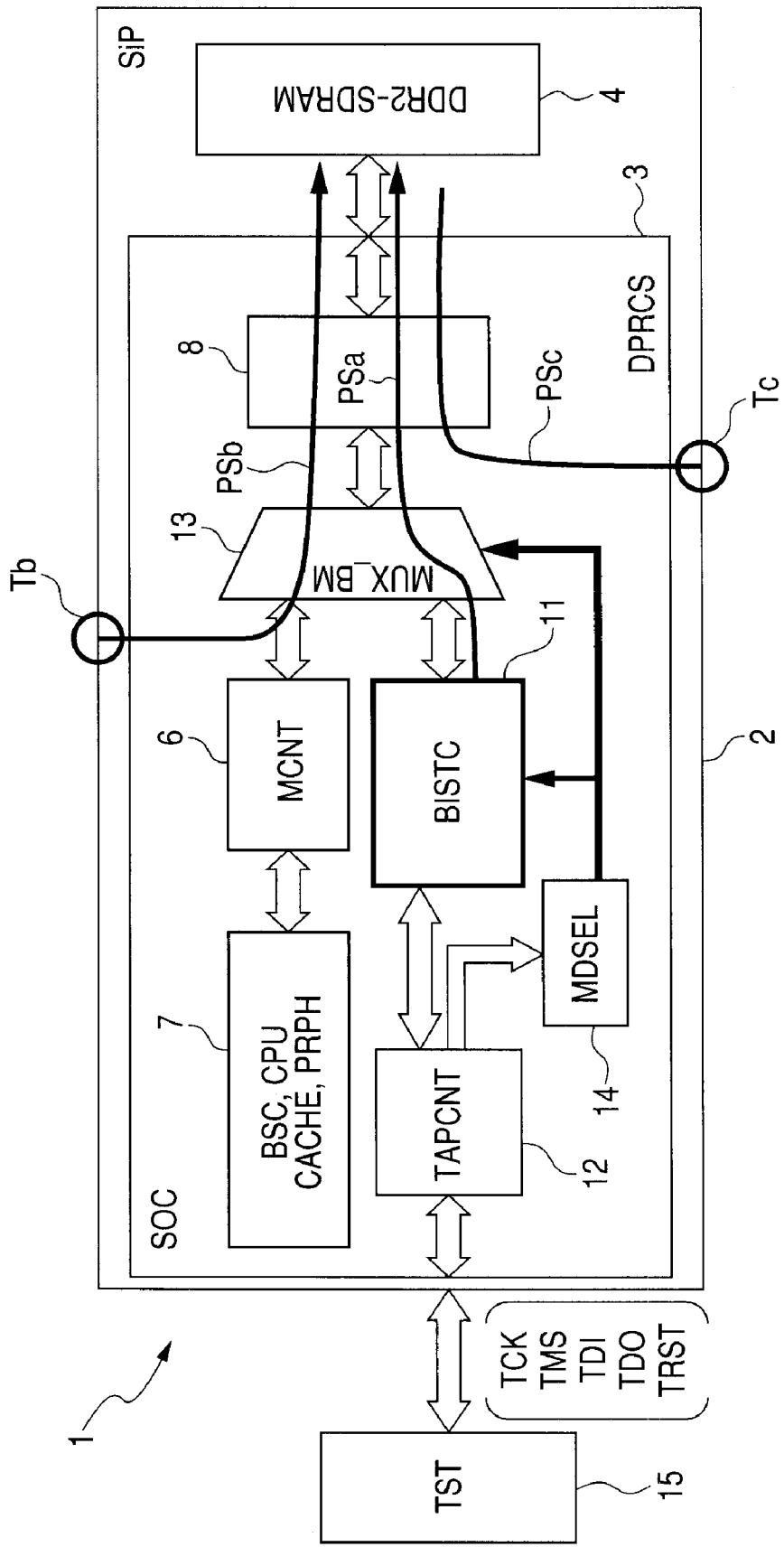
FIG. 16 is an explanatory diagram illustrating a plurality of kinds of methods for determining the initial value of a clock enable signal cke.

The bit CIF2 determines the initial value (low or high level) of the clock enable signal cke of the DDR2-SDRAM 4. As illustrated in FIG. 16, the determination of the initial value of the clock enable signal cke is not limited to reverse setting performed by the BISTC 11 as shown by a path PSa, but the initial value of the clock enable signal cke may be set by a level at an external terminal Tb through the MUX_BM 13 as shown by a path PSb, or may be set by a level at an external terminal Tc directly through the PHYLOG 8 as shown by a path PSc. Thereby, it is possible to, easily deal with the difference between memory specifications for the clock enable signal.

By inverting the switching control bit CIF3 from an initial value, the coupling of the MCNT 6 to the PHYLOG 8 by the MUX_BM 13 is switched to the coupling of the BISTC 11 to the PHYLOG 8.

According to the semiconductor module described above, the following operational advantages can be obtained as a whole. The multiplexer (MUX_BM) 13 selects the BISTC 11 in accordance with control information inputted through the TAPCNT 12 from the tester 15, so that the BISTC 11 can perform self-testing on the external memory. With this, the content of self-testing is not limited by the function of the memory controller 6. The built-in self-test circuit 11 can generate the address ADR, the data DAT, and the command MCMD for a memory test, in response to an instruction according to the specification of the memory to be tested, from the TAP controller 12. Accordingly, the individual design change of the BIST circuit 11 in accordance with the difference of the specification of the memory to be tested can be reduced, which can facilitate the broad adaptation of the BIST circuit 11 and contribute to a reduction in test design cost. Since the TAP controller 12 is used to set control data in the BIST circuit and collect test result data, an input/output interface with the tester can be performed using a test clock TCK having a lower frequency than a memory clock frequency which regulates the memory operation speed of the DDR2-SDRAM 4 to be tested. Further, the number of terminals required for interface with the tester can be small. In particular, since the BISTC 11 is coupled to the PHYLOG 8, even in the case of testing a memory of a greatly different type or function such as a special physical interface, the provision of the PHYLOG for supporting the memory can minimize the change of the BISTC 11.

Figure 17:
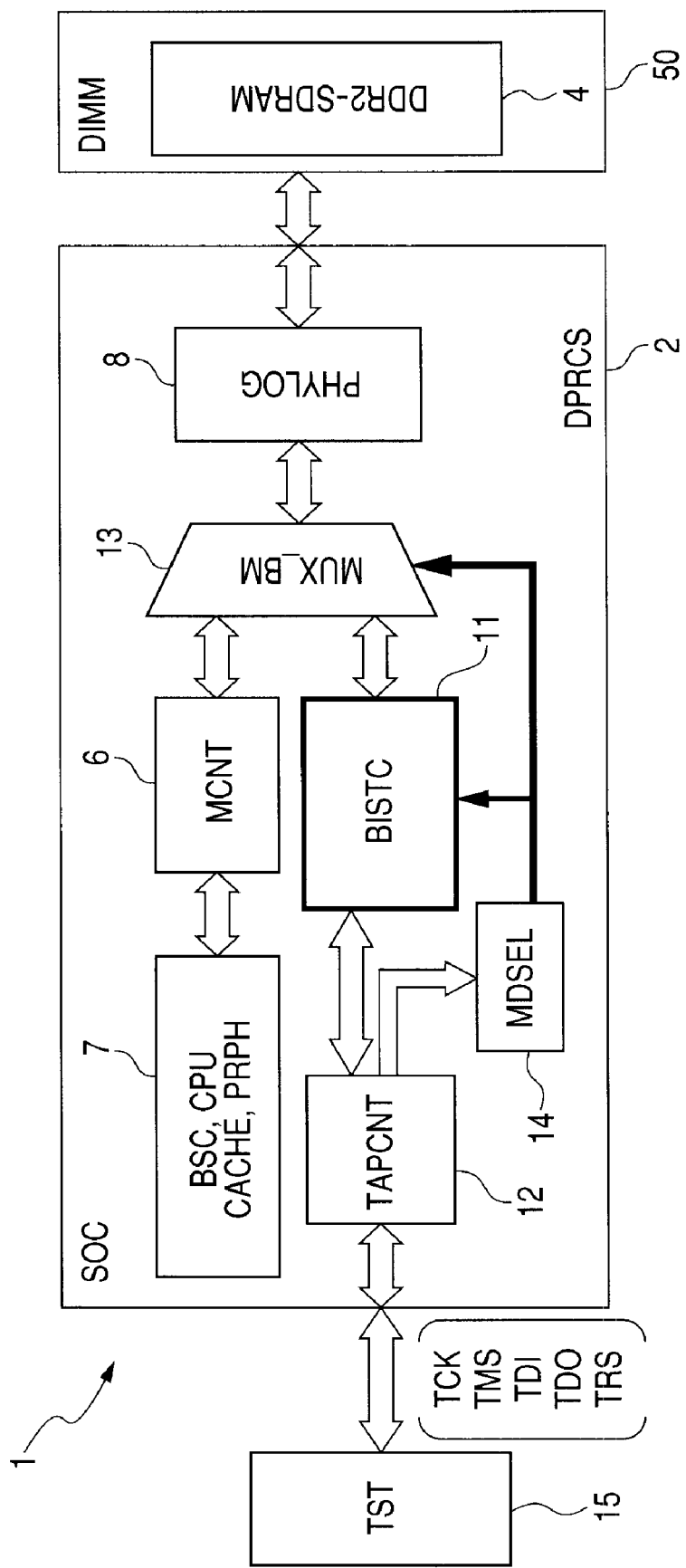
FIG. 17 is a block diagram showing another example of a semiconductor device according to the invention.

FIG. 17 shows another example of the semiconductor device according to the invention. In this example, the chip of the data processor 3 alone is sealed with a resinous package and mounted on a mounting board (not shown). A memory module 50 is in DIMM (Dual Inline Memory Module) form and is a memory to be tested. The memory module 50, along with the data processor 3, is mounted on the mounting board and, for example, used as a main memory of the data processor 3. In this usage of the data processor 3, the same operational advantages can be obtained in self-testing the memory 4.

While the invention made above by the present inventors has been described specifically based on the illustrated embodiments, the present invention is not limited thereto. It is needless to say that various changes and modifications can be made thereto without departing from the spirit and scope of the invention.

For example, the memory to be tested is not limited to the DDR2-SDRAM but may be a DDR-SDRAM, a faster synchronous DRAM, a synchronous SRAM, and an electrically rewritable nonvolatile memory such as a flash memory. The physical interface typified by the PHYLOG 8 has a structure according to a memory to be tested, and may be simply an input/output buffer in the case of a memory that does not require a special physical interface. Further, the IEEE1149.1 Access Port standard is commonly referred to as JTAG (Joint Test Action Group). Although the command input enable signal cs_n[i:0] has the same symbol CS as a chip selection signal, the present invention is not limited thereto.

What is claimed is:

1. A semiconductor device comprising:
    a memory interface capable of being coupled to an external memory;
    a processing unit for performing data processing including data processing based on data of the external memory;
    a built-in self-test circuit for generating a test signal for testing the external memory;
    a multiplexer for switchably coupling the processing unit or the built-in self-test circuit to the memory interface; and
    a terminal to which a signal for instructing the multiplexer to switch between the processing unit and the built-in self-test circuit is inputted.

2. The semiconductor device according to claim 1, wherein the terminal is coupled to the multiplexer through an IEEE1149.1-compliant TAP controller to control the built-in self-test circuit and refer to a test result.

3. The semiconductor device according to claim 2, wherein the terminal is coupled to the built-in self-test circuit through the TAP controller.

4. The semiconductor device according to claim 3,
    wherein the processing unit includes a logic circuit which can be an access requesting entity for the external memory and a memory controller for controlling the external memory in response to an access request from the logic circuit, and
    wherein the built-in self-test circuit programmably generates an address, data, and a command for a memory test in accordance with an instruction inputted through the TAP controller and outputs them through the memory interface, and can compare data read from the external memory with expected data.

5. The semiconductor device according to claim 4, wherein the built-in self-test circuit includes a comparison circuit for comparing data read from the external memory with expected data read through the TAP controller and an input selection circuit for allowing expected data to be selectively inputted to both an expected data input terminal and a read data input terminal of the comparison circuit.

6. The semiconductor device according to claim 3, wherein the built-in self-test circuit includes a comparison determination circuit for comparing data read from the external memory with expected data read through the TAP controller and successively overwrite-storing memory access information pertaining to a comparison determination result of a mismatch until the number of mismatches of comparison determination results reaches a specified number.

7. The semiconductor device according to claim 1, wherein in the case where the multiplexer is coupled to the built-in self-test circuit, before a command input enable indicating that a command to the external memory is valid, an address strobe signal is enabled and an address signal is established for output through the memory interface.

8. The semiconductor device according to claim 7, wherein the built-in self-test circuit enables a row address strobe signal and establishes a row address signal before a row-address command input enable, and enables a column address strobe signal and establishes a column address signal before a column-address command input enable.

9. The semiconductor device according to claim 7,
    wherein the interface has output terminals of a plurality of pairs of command input enable signals and clock enable signals which are selectively made valid along with an address, data, and a data strobe signal, and
    wherein a plurality of external memories which receive an address, data, and a data strobe signal in common are selectively made operable.

10. The semiconductor device according to claim 9, wherein the built-in self-test circuit can select a high level or a low level as an initial value of a clock enable signal.

11. The semiconductor device according to claim 1,
    wherein the built-in self-test circuit includes a plurality of command tables for converting a command of a predetermined command set into a command of a memory command set according to a specification of the external memory, and
    wherein a multiplexer can select an output of the command tables in accordance with a selection signal outputted from a command table.

12. The semiconductor device according to claim 1, wherein the built-in self-test circuit programmably generates and outputs an address, data, and a command for testing the external memory, and can generate and output pseudorandom numbers as the address and the data for testing the external memory.

13. The semiconductor device according to claim 1, wherein the memory interface can be coupled to the external memory through wiring provided outside the semiconductor device.

14. The semiconductor device according to claim 13, wherein the memory interface can be coupled to a clock synchronous type DRAM, as the external memory, for performing data input/output operation with an outside in synchronization with rising edge and falling edge of a clock signal.

15. A semiconductor device comprising:
    an external memory; and
    a data processor coupled to the external memory,
    the data processor including:
    a memory interface coupled to the external memory;
    an access requesting entity;

a memory controller for controlling the external memory in response to an access request from the access requesting entity;

a built-in self-test circuit for use in testing the external memory;

a multiplexer for switchably coupling the memory controller or the built-in self-test circuit to the memory interface; and a terminal for providing data or a signal to the data processor, wherein the built-in self-test circuit programmably generates an address, data, and a command for a memory test in accordance with an instruction inputted through the terminal and outputs them through the memory interface, and wherein the multiplexer selects the built-in self-test circuit in accordance with control information externally inputted through the terminal.

16. The semiconductor device according to claim 15, wherein the built-in self-test circuit can compare data read from the external memory with expected data.

17. The semiconductor device according to claim 15, wherein the terminal is coupled to the multiplexer through an IEEE1149.1-compliant TAP controller for controlling the built-in self-test circuit and referring to a test result.

18. The semiconductor device according to claim 15, wherein the external memory and the data processor are formed in mutually different semiconductor chips.

19. The semiconductor device according to claim 18, wherein the external memory and the data processor are mounted on a module board and sealed with resin, with an external interface terminal of the data processor being exposed.

20. A semiconductor device which is overall sealed with resin comprising:

a memory interface to which a memory can be externally coupled;

a logic circuit which can be an access requesting entity;

a memory controller for controlling the memory in response to an access request from the logic circuit;

a built-in self-test circuit for use in testing the memory;

an IEEE1149.1-compliant TAP controller for controlling the built-in self-test circuit and referring to a test result; and a multiplexer for switchably coupling the memory controller or the built-in self-test circuit to the memory interface;

wherein the built-in self-test circuit programmably generates and outputs an address, data, and a command for a memory test in accordance with an instruction inputted through the TAP controller, and can compare data read from the memory with expected data, and wherein the multiplexer selects the built-in self-test circuit in accordance with control information externally inputted through the TAP controller.

* * * * *